US012782444B2

(12) United States Patent
Park

(10) Patent No.: US 12,782,444 B2
(45) Date of Patent: Nov. 3, 2026

(54) BATTERY DIAGNOSING APPARATUS AND METHOD

(71) Applicant: LG ENERGY SOLUTION, LTD., Seoul (KR)

(72) Inventor: Jun-Cheol Park, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 588 days.

(21) Appl. No.: 18/034,911

(22) PCT Filed: Oct. 7, 2021

(86) PCT No.: PCT/KR2021/013829

§ 371 (c)(1),
(2) Date: May 2, 2023

(87) PCT Pub. No.: WO2022/108111

PCT Pub. Date: May 27, 2022

(65) Prior Publication Data

US 2024/0036115 A1 Feb. 1, 2024

(30) Foreign Application Priority Data

Nov. 19, 2020 (KR) ........................ 10-2020-0156002

(51) Int. Cl.
*G01R 31/367* (2019.01)
*G01R 31/389* (2019.01)
*G01R 31/392* (2019.01)

(52) U.S. Cl.
CPC ......... *G01R 31/367* (2019.01); *G01R 31/389* (2019.01); *G01R 31/392* (2019.01)

(58) Field of Classification Search
None
See application file for complete search history.

(56) References Cited

U.S. PATENT DOCUMENTS 9,859,738 B2 1/2018 Ling et al.
2012/0018253 A1 1/2012 Ziegler et al.
(Continued)

FOREIGN PATENT DOCUMENTS

CA 2 873 996 A1 12/2013
CN 109765496 A 5/2019
(Continued)

OTHER PUBLICATIONS

International Search Report (PCT/ISA/210) issued in PCT/KR2021/013829 mailed on Jan. 24, 2022.
(Continued)

*Primary Examiner* — Raymond L Nimox
(74) *Attorney, Agent, or Firm* — Birch, Stewart, Kolasch & Birch, LLP

(57) ABSTRACT

Discussed is a battery diagnosing apparatus that may include an impedance measuring module configured to measure an impedance according to a change of frequency while applying an alternating current (AC) voltage to a target battery, a memory module configured to store an impedance reference value per frequency, and a processor configured to generate a Nyquist diagram for an impedance measurement value of the target battery measured by the impedance measuring module, extract an inflection point from the generated Nyquist diagram, and compare a value within a predetermined frequency range centering around the extracted inflection point with the impedance reference value per frequency stored in the memory module to diagnose the target battery.

13 Claims, 7 Drawing Sheets

(56) References Cited

U.S. PATENT DOCUMENTS

| | | | | |
|---|---|---|---|---|
| 2012/0019253 | A1* | 1/2012 | Ziegler | H01M 10/48 324/433 |
| 2012/0182020 | A1 | 7/2012 | Akutsu et al. | |
| 2013/0030736 | A1 | 1/2013 | Tanaka | |
| 2013/0069660 | A1 | 3/2013 | Bernard et al. | |
| 2013/0229156 | A1 | 9/2013 | Brandon et al. | |
| 2014/0229130 | A1 | 8/2014 | Koba et al. | |
| 2017/0185733 | A1 | 6/2017 | Nogueira et al. | |
| 2019/0023131 | A1 | 1/2019 | Katayama et al. | |
| 2019/0041371 | A1 | 2/2019 | Dinsmore | |
| 2019/0331738 | A1 | 10/2019 | Kodama | |
| 2020/0326380 | A1 | 10/2020 | Wuebbeler et al. | |

FOREIGN PATENT DOCUMENTS

| | | | | | |
|---|---|---|---|---|---|
| CN | 110573869 | A | | 12/2019 | |
| DE | 10 2009 000 337 | A | | 7/2010 | |
| JP | 2010160055 | A | * | 7/2010 | |
| JP | 2010-537198 | A | | 12/2010 | |
| JP | 2013-519893 | A | | 5/2013 | |
| JP | 2013-137955 | A | | 7/2013 | |
| JP | 5278508 | B2 | | 9/2013 | |
| JP | 2013-235795 | A | | 11/2013 | |
| JP | 2014-25850 | A | | 2/2014 | |
| JP | 2016-166880 | A | | 9/2016 | |
| JP | WO2017/179266 | A1 | | 9/2018 | |
| JP | 6466287 | B2 | | 2/2019 | |
| JP | 2019-158448 | A | | 9/2019 | |
| JP | 2019-191030 | A | | 10/2019 | |
| JP | 6675725 | B1 | | 4/2020 | |
| KR | 10-2011-0105047 | A | | 9/2011 | |
| KR | 10-1288647 | B1 | | 7/2013 | |
| KR | 10-2014-0034717 | A | | 3/2014 | |
| KR | 10-1627941 | B1 | | 6/2016 | |
| KR | 10-2018-0062814 | A | | 6/2018 | |
| WO | WO 2016/071801 | A1 | | 5/2016 | |
| WO | WO-2018101620 | A1 | * | 6/2018 | H01M 10/48 |
| WO | WO 2019/199064 | A1 | | 10/2019 | |
| WO | WO 2020/223881 | A1 | | 11/2020 | |

OTHER PUBLICATIONS

Locorotondo et al., "Electrochemical Impedance Spectroscop of Li-Ion Battery On-Board the Electric Vehides Based on Fast Nonparametric Identification Method", 2019 International Conference on Environment and Electrical Engineering, Industrial and Commercial Power Systems , IEEE, Jun. 11, 2019, XP033587362, pp. 1-6.

Supplementary European Search Report for European Application No. 21894883.4, dated Mar. 11, 2024.

* cited by examiner

| FREQUENCY | f1 | f2 | f3 | f4 | f5 | f6 | f7 | .... |
|---|---|---|---|---|---|---|---|---|
| IMPEDANCE | Zre1 | Zre2 | Zre3 | Zre4 | Zre5 | Zre6 | Zre7 | .... |

| FREQUENCY [Hz] | 2.154 | 1.468 | 1 | 0.681 | 0.464 |
|---|---|---|---|---|---|
| IMPEDANCE MAGNITUDE [mΩ] | 0.89 | 0.39 | 0 | 0.29 | 0.50 |
| IMPEDANCE ANGLE [°] | -146.0 | -141.7 | 0 | 38.3 | 38.0 |

FIG. 7

| [Level 1] | | | | | |
|---|---|---|---|---|---|
| FREQUENCY [Hz] | 2.154 | 1.468 | 1 | 0.681 | 0.464 |
| IMPEDANCE MAGNITUDE [mΩ] | 0.81 | 0.33 | 0 | 0.25 | 0.42 |
| IMPEDANCE ANGLE [°] | -137 | -135.7 | 0 | 45.2 | 40.8 |

| [Level 2] | | | | | |
|---|---|---|---|---|---|
| FREQUENCY [Hz] | 2.154 | 1.468 | 1 | 0.681 | 0.464 |
| IMPEDANCE MAGNITUDE [mΩ] | 0.89 | 0.39 | 0 | 0.29 | 0.50 |
| IMPEDANCE ANGLE [°] | -146.0 | -141.7 | 0 | 38.3 | 38.0 |

| [Level 3] | | | | | |
|---|---|---|---|---|---|
| FREQUENCY [Hz] | 2.154 | 1.468 | 1 | 0.681 | 0.464 |
| IMPEDANCE MAGNITUDE [mΩ] | 0.94 | 0.43 | 0 | 0.35 | 0.59 |
| IMPEDANCE ANGLE [°] | -139.0 | -138.7 | 0 | 36.7 | 37.3 |

BATTERY DIAGNOSING APPARATUS AND METHOD

TECHNICAL FIELD

The present application claims priority to Korean Patent Application No. 10-2020-0156002 filed on Nov. 19, 2020 in the Republic of Korea, the disclosures of which are incorporated herein by reference.

The present disclosure relates to a battery diagnosing technology, and more particularly, to a battery diagnosing technology capable of effectively diagnosing a state of a battery through an impedance measurement value.

BACKGROUND ART

Currently commercialized secondary batteries include nickel-cadmium batteries, nickel-hydrogen batteries, nickel-zinc batteries, lithium secondary batteries, and the like. Among them, the lithium secondary batteries are spotlighted because they ensure free charging and discharging due to substantially no memory effect compared to nickel-based secondary batteries, as well as very low discharge rate and high energy density.

Moreover, recently, secondary batteries have been widely used for driving or energy storage in medium and large-sized devices such as electric vehicles or energy storage systems (ESS). In addition, for this reason, the interest in secondary batteries is further increased, and related research and development are being made more actively.

The lithium secondary battery mainly uses lithium-based oxide and carbon material as positive electrode active material and negative electrode active material, respectively. Also, the lithium secondary battery includes an electrode assembly in which a positive electrode plate and a negative electrode plate respectively coated with a positive electrode active material and a negative electrode active material are arranged with a separator interposed therebetween, and an exterior, namely a battery case, for hermetically receiving the electrode assembly together with electrolyte.

A battery generates electrical energy through electrochemical oxidation and reduction reactions. However, as the charge/discharge cycle is repeated, the battery does not maintain the capacity at the time of initial manufacture, namely the performance in a BOL (Beginning Of Life) state, and may be degraded over time. If the degradation state of the battery is not properly understood, it may be difficult to accurately predict the state of charge (SOC), usable time, lifespan, replacement timing, or the like of the battery. In addition, if the prediction is not made accurately in this aspect, it may cause unexpected damage to a user or manager of the battery.

Moreover, recently, batteries are recycled more and more. In particular, when the performance of a battery pack mounted to an electric vehicle deteriorates due to use for a certain period of time, researches and projects to install the used battery pack in other applications, such as an Energy Storage System (ESS) so as to be reused are being actively pursued.

If the already used battery (waste battery) is to be recycled in another field or in the same field in this way, it is required to more accurate diagnose the state of the battery. For example, in order to employ a battery pack for a vehicle in an energy storage system, it should be determined whether the battery pack is recyclable. Until now, various technologies for diagnosing battery cells, battery modules, battery packs, or the like have been proposed, but it is difficult to say that they exhibit sufficient performance in various aspects such as accuracy and speed.

In particular, as one of conventional representative techniques for diagnosing a battery, there is a method using electrochemical impedance spectroscopy (EIS). In this case, a Nyquist diagram (Nyquist plot) for the EIS measurement data is used, and in this process, it is necessary to extract each element constant for an equivalent circuit model of the battery.

However, in the prior art using such an equivalent circuit model, there is a limit in that a perfect equivalent circuit model cannot be implemented. In particular, during the EIS measurement, it is difficult to distinguish the inductance and resistance components of a measurement probe and a contact resistance at the measurement point from the inductance and resistance components of the battery itself. In addition, since the inductance component of the measurement probe has a large deviation for every measurement, it may greatly affect a high frequency band, particularly a resistance component indicated by the SEI (Solid Electrolyte Interphase).

Therefore, according to the prior art, there is a problem in that it is difficult to ensure sufficient accuracy in diagnosing a battery using the Nyquist diagram. If the state of the battery is not accurately diagnosed before the battery is reused, it may adversely affect the device or system in which the battery is reused as well as the user who reuses the battery.

DISCLOSURE

Technical Problem

The present disclosure is designed to solve the problems of the related art, and therefore the present disclosure is directed to providing an apparatus and method, which may diagnose a battery with high accuracy using a Nyquist diagram.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided a battery diagnosing apparatus, including: an impedance measuring module configured to measure an impedance according to a change of frequency while applying an alternating current (AC) voltage to a target battery; a memory module configured to store an impedance reference value per frequency; and a processor configured to generate a Nyquist diagram for an impedance measurement value of the target battery measured by the impedance measuring module, extract an inflection point from the generated Nyquist diagram, and compare a value within a predetermined frequency range centering around the extracted inflection point with the impedance reference value per frequency stored in the memory module to diagnose the target battery.

Here, the processor may be configured to shift the generated Nyquist diagram such that the extracted inflection point becomes an origin and compare the impedance measurement value with the impedance reference value per frequency in the shifted state.

In addition, the processor may be configured to diagnose the target battery using a magnitude and an angle of the impedance measurement value for the target battery.

In addition, the memory module may be configured to store the impedance reference value per frequency to be classified into each of a plurality of battery levels, and the processor may be configured to classify a level of the target battery by matching the impedance measurement value of the target battery with a battery level stored in the memory module from among the plurality of battery levels.

In addition, the processor may be configured to extract a point where a charge transfer resistance region is inflected by a diffusion resistance region as the inflection point in the generated Nyquist diagram.

In addition, the processor may be configured to extract the inflection point by searching the generated Nyquist diagram from a low frequency region to a high frequency region thereof.

In addition, the memory module may be configured to store preliminary frequency information for the inflection point in advance.

In addition, in another aspect of the present disclosure, there is provided a battery pack, including the battery diagnosing apparatus according to the present disclosure.

In addition, in still another aspect of the present disclosure, there is provided an energy storage system including the battery diagnosing apparatus according to the present disclosure.

In addition, in still another aspect of the present disclosure, there is provided battery diagnosing method including: storing an impedance reference value per frequency; measuring an impedance according to a change of frequency while applying an alternating current (AC) voltage to a target battery; generating a Nyquist diagram for an impedance measurement value of the target battery measured in the measuring operation; extracting an inflection point from the Nyquist diagram generated in the generating operation; comparing the impedance measurement value within a predetermined frequency range centering around the inflection point extracted in the extracting operation with the impedance reference value per frequency stored in the storing operation; and diagnosing the target battery based on a comparison result of the comparing operation.

Advantageous Effects

According to the present disclosure, an effective battery diagnosing apparatus is provided.

In particular, according to an embodiment of the present disclosure, since the battery is diagnosed using the Nyquist plot without using an equivalent circuit model, there is no need to extract various element constant values related to the equivalent circuit model.

Therefore, according to this embodiment of the present disclosure, accuracy and/or speed of battery diagnosis may be improved.

Moreover, according to an embodiment of the present disclosure, in analyzing EIS measurement data, the influence of inductance and resistance components of the measurement probe may be minimized by using a low frequency region rather than a high frequency region.

Therefore, according to this embodiment of the present disclosure, the accuracy of battery diagnosis may be further improved.

In addition, in reusing a battery module or a battery pack, the present disclosure may be easily applied to classify a level for the battery module or the battery pack.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

FIG. 7 is a diagram showing a part of impedance reference value data stored in the memory module according to another embodiment of the present disclosure.

Best Mode

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Figures 1, 2:
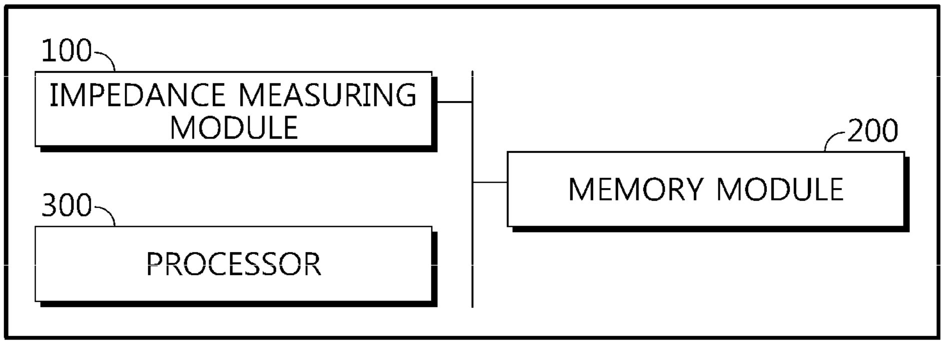
FIG. 1 is a block diagram schematically showing a configuration of a battery diagnosing apparatus according to an embodiment of the present disclosure.
FIG. 2 is a diagram schematically showing an impedance reference value stored in a memory module according to an embodiment of the present disclosure.

FIG. 1 is a block diagram schematically showing a configuration of a battery diagnosing apparatus according to an embodiment of the present disclosure.

Referring to FIG. 1, the battery diagnosing apparatus according to the present disclosure includes an impedance measuring module 100, a memory module 200, and a processor 300.

The impedance measuring module 100 may be configured to measure an impedance for a target battery. In particular, the impedance measuring module 100 may measure the impedance of the target battery by using an electrochemical impedance spectroscopy (EIS). Here, the target battery means a battery that becomes a diagnosis target. For example, the target battery may be a battery module or battery pack including a plurality of battery cells. Alternatively, the target battery may refer to a battery cell, namely one secondary battery.

The impedance measuring module 100 may be configured to apply an AC voltage to the target battery in order to measure the impedance of the target battery. For example, the impedance measuring module 100 may be configured to charge the target battery while applying an AC voltage, and measure an internal impedance of the target battery in the charging process. In particular, the impedance measuring module 100 may be configured to apply an AC voltage while changing the frequency.

The impedance measuring module 100 may employ various impedance measuring configurations and techniques known at the time of filing of this application. For example, the impedance measuring module 100 may be configured to measure the internal impedance of the battery using a 4-terminal pair method.

In addition, the impedance measuring module 100 may include several components for measuring the internal impedance of the battery. For example, the impedance measuring module 100 may include a contact probe for contacting a terminal of the battery, a power supply for generating and supplying an AC power, a power cable and a voltage sensor provided between the power supply and the contact probe, and the like. As such, since the impedance measuring module 100 of the present disclosure may employ a known conventional impedance measuring configuration and will not be described in detail.

The memory module 200 stores an impedance reference value. Here, the impedance reference value is a value to be compared with the impedance measurement value of the target battery measured by the impedance measuring module 100, and may be stored in advance. In particular, the impedance reference value may be a value obtained in advance through a plurality of pre-experiments for a reference battery whose specification, type, characteristic, or the like is identical or similar to that of the target battery.

In addition, the impedance reference value may be measured and stored in the same or similar manner as the impedance measurement method by the impedance measuring module 100. For example, the impedance reference value stored in the memory module 200 may be obtained by applying an AC voltage with the same or similar voltage magnitude and frequency as the voltage magnitude and frequency when the impedance measuring module 100 measures the impedance of the target battery.

FIG. 2 is a diagram schematically showing an impedance reference value stored in the memory module 200 according to an embodiment of the present disclosure.

Referring to FIG. 2, the memory module 200 may store the impedance reference value for each frequency. That is, the memory module 200 may be configured to classify frequencies into a plurality of frequencies (f1, f2, f3, f4, f5, f6, f7, . . . ) within a predetermined frequency range, so that an impedance reference value (Zre1, Zre2, Zre3, Zre4, Zre5, Zre6, Zre7, . . . ) is preset at each classified frequency to correspond thereto.

For example, the memory module 200 may store an impedance reference value corresponding to each of a plurality of frequencies included between 0.1 Hz and 10 Hz in advance.

In addition to the above, the memory module 200 may further store data or programs required for other components of the battery diagnosing apparatus according to the present disclosure, such as the impedance measuring module 100 or the processor 300, to operate or perform their functions.

The memory module 200 may be implemented as at least one of flash memory type, hard disk type, SSD (Solid State Disk) type, SDD (Solid Disk Drive) type, multimedia card micro type, RAM (RAM, Random Access Memory) type, SRAM (Static RAM) type, ROM (Read Only Memory) type, EEPROM (Electrically Erasable Programmable Read Only Memory) type, and PROM (Programmable Read Only Memory) type, but the present disclosure is not necessarily limited to such a specific form of the memory module 200.

The processor 300 may be connected to the impedance measuring module 100 and configured to receive the impedance measurement value from the impedance measuring module 100. That is, when the impedance measuring module 100 measures the impedance for the target battery, the measured result may be transmitted to the processor 300. In addition, the processor 300 may be configured to generate a Nyquist diagram (Nyquist plot) for the impedance measurement value of the target battery based on the impedance measurement result transmitted from the impedance measuring module 100 in this way. In particular, the impedance measuring module 100 may measure the impedance using the EIS analysis method. In addition, the EIS analysis data may be shown as a Nyquist plot.

Figure 3:
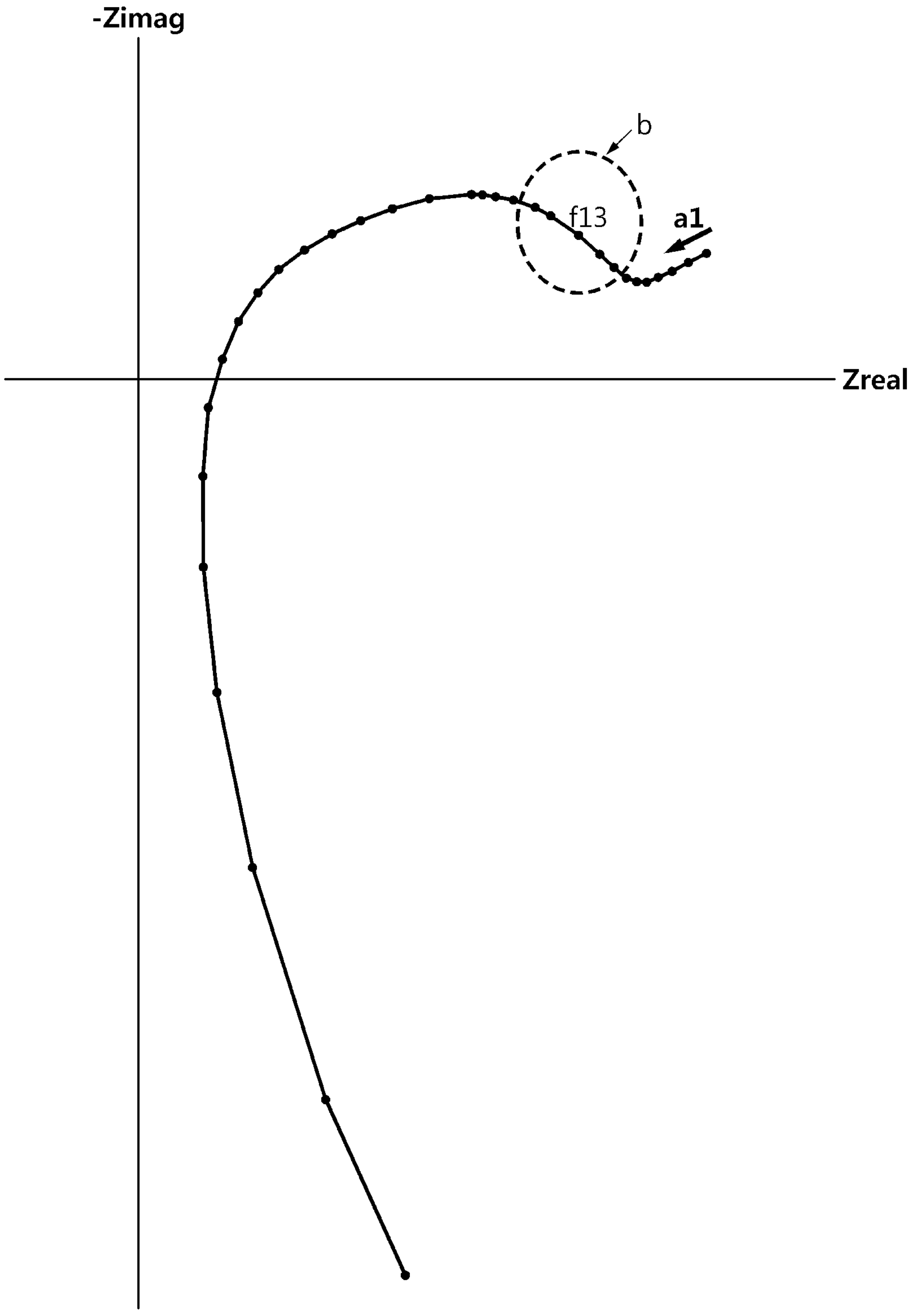
FIG. 3 is a diagram schematically showing an example of a Nyquist diagram generated by a processor according to an embodiment of the present disclosure.

FIG. 3 is a diagram schematically showing an example of a Nyquist diagram generated by the processor 300 according to an embodiment of the present disclosure.

Referring to FIG. 3, the Nyquist diagram may be generated through the EIS measurement result of the target battery. In the Nyquist diagram, the horizontal axis may be a real component (Zreal) of the impedance, and the vertical axis may be an imaginary component (Zimag) of the impedance. In addition, the unit of the horizontal axis and the vertical axis may be mΩ or Ω Also, each point may be called an impedance measurement value according to each frequency, namely an impedance point. Moreover, it may be regarded that the magnitude of the frequency of each impedance point gradually increases in the direction indicated by an arrow a1. In the Nyquist diagram, the real value and the imaginary value of the impedance for the target battery are changed according to the change of frequency, and thus their intersection point may be displayed as a point on the coordinates, namely the impedance point.

The processor 300 may generate the Nyquist diagram based on the impedance measurement value transmitted from the impedance measuring module 100. In this case, the processor 300 may employ a Nyquist diagram generating technique known at the time of filing of this application, and thus will not be described in detail here.

If the Nyquist diagram for EIS measurement data is generated as above, the processor 300 may be configured to extract an inflection point from the generated Nyquist diagram. Here, the inflection point may refer to a point where the direction of curvature is changed in the EIS Nyquist diagram. From the point of view of differential and integral calculus, for a function that is differentiable twice, the inflection point may refer to a point where the graph of the function changes from a upward convex state to a downward convex state, or from a downward convex state to an upward convex state. That is, the inflection point may refer to a point where the negative and positive (–, +) of curvature change in a plane curve. The processor 300 may be configured to extract the inflection point from the EIS Nyquist diagram.

If the inflection point is extracted from the EIS Nyquist diagram as above, the processor 300 may select at least one value belonging to a predetermined frequency range centering around the extracted inflection point. In addition, the processor 300 may be configured to compare the value selected around the inflection point in this way with the impedance reference value per frequency stored in the memory module 200.

For example, in the configuration of FIG. 3, when the inflection point is extracted as an impedance point indicated by f13 on the Nyquist diagram, the processor 300 may select impedance points belonging to the portion indicated by b that is within the predetermined frequency range centering around the inflection point f13. At this time, the processor 300 may identify the frequency and the impedance measurement value per frequency with respect to the impedance points within the portion indicated by b, respectively.

In addition, the processor 300 may identify the impedance measurement value of the selected impedance points and the impedance reference value corresponding thereto from the memory module 200. That is, the processor 300 may read an impedance reference value corresponding to a frequency identical to or similar to that of the selected impedance point from the memory module 200. In addition, the processor 300 may compare the impedance reference value read in this way and the impedance measurement value of the selected impedance point with each other.

For example, when the frequencies of the impedance points within the region b set around the inflection point f13 in the embodiment of FIG. 3 correspond to f2 to f6 in the embodiment of FIG. 2, the processor 300 may compare the impedance measurement values of the impedance points within the region b with the impedance reference values corresponding to f2 to f6 of the memory module, namely Zre2 to Zre6.

In addition, the processor 300 may be configured to diagnose the target battery based on the comparison result of the impedance measurement value and the impedance reference value.

For example, when the impedance measurement value is out of the impedance reference value over an error range, the processor 300 may diagnose that the target battery is abnormal. In this case, the impedance reference value may be set as a reference value for determining whether the target battery is abnormal. As another example, the processor 300 may be configured to search for an impedance reference value that is the same as an impedance measurement value or is within an error range thereof. In this case, the memory module 200 may store various information for diagnosing the state of the target battery to be matched with respect to each impedance reference value. For example, the memory module 200 may store SOH (State Of Health) information of the battery to be matched with respect to each impedance reference value. In addition, the processor 300 may diagnose the state of the target battery through the information matched with the searched impedance reference value.

According to this configuration of the present disclosure, the battery may be diagnosed simply and accurately. In particular, according to the configuration of the present disclosure, when a battery is diagnosed using EIS data, an equivalent circuit model for the battery is unnecessary. Therefore, there is no need to extract various constant values for the equivalent circuit model of the EIS Nyquist diagram in relation to the battery. Therefore, according to this embodiment of the present disclosure, not only the diagnosis process is simple, but also errors or the like occurring in the constant value extraction process may be excluded. Therefore, in this case, the battery may be efficiently diagnosed using the EIS Nyquist diagram.

Meanwhile, the processor 300 may optionally include central processing units (CPUs), application-specific integrated circuits (ASIC), chipsets, logic circuits, registers, communication modems, data processing devices, or the like, known in the art, to execute various control logics performed in the present disclosure, or may be expressed using these terms. In addition, when a control logic is implemented in software, the processor 300 may be implemented as a set of program modules. In this case, the program module may be stored in an internal memory or an external memory module 200 or the like and executed by the processor 300. The memory module 200 may be provided inside or outside the processor 300, and may be connected to the processor 300 through various well-known means.

In particular, if the diagnosing apparatus according to the present disclosure is implemented in the form of being included in a battery pack, the battery pack may include a control device that is referred to as a microcontroller unit (MCU) or a battery management system (BMS). At this time, the processor 300 may be implemented by components such as the MCU or the BMS provided in a general battery pack.

Meanwhile, in this specification, terms such as 'to be' or 'configured to be' for an operation or function of the processor 300 may include the meaning of 'programmed to be'.

In addition, when the inflection point is extracted by generating the Nyquist diagram according to the EIS measurement, the processor 300 may shift the Nyquist diagram so that the extracted inflection point becomes the origin. In addition, with respect to the Nyquist diagram in the shifted state, the processor 300 may be configured to compare and analyze the impedance reference value per frequency. This will be described in more detail with reference to FIG. 4.

Figure 4:
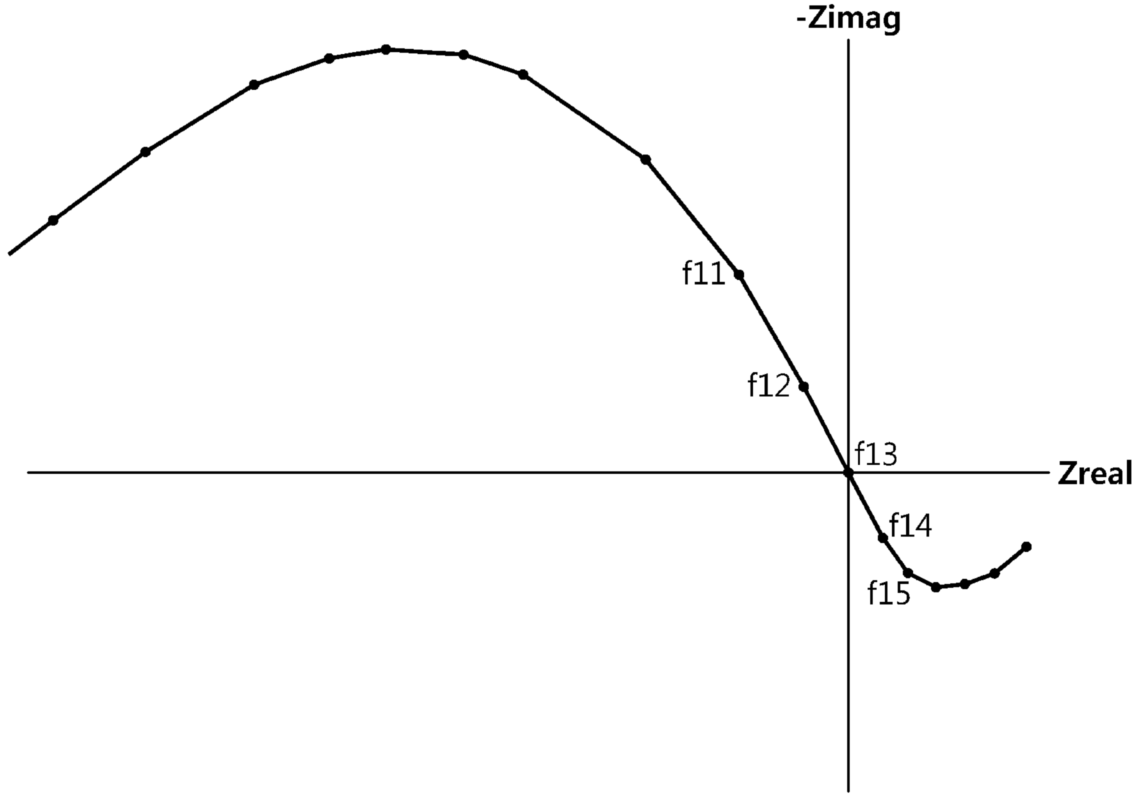
FIG. 4 is a diagram schematically showing a configuration in which the Nyquist diagram of FIG. 3 is shifted such that the extracted inflection point becomes an origin.

FIG. 4 is a diagram schematically showing a configuration in which the Nyquist diagram of FIG. 3 is shifted such that the extracted inflection point becomes an origin. However, in FIG. 4, a partial high-frequency region in the Nyquist diagram of FIG. 3 is excluded for convenience of illustration.

Referring to FIG. 4, the Nyquist diagram is shifted such that the inflection point f13 extracted in the embodiment of FIG. 3 becomes the origin. That is, the Nyquist diagram of FIG. 4 may be regarded to be a form in which the inflection point f13 is located at the origin by moving the Nyquist diagram of FIG. 3 in the left direction and the lower direction while maintaining the coordinate axis.

In addition, the processor 300 may be configured to compare the impedance measurement value within the predetermined frequency around the origin of the Nyquist diagram, namely the inflection point f13, with the impedance reference value corresponding to the corresponding frequency.

According to this configuration of the present disclosure, by locating the inflection point at the origin, the impedance measurement value and the impedance reference value may be compared more clearly. Moreover, according to this embodiment, when the impedance reference value stored in the memory module 200 is stored in the form of a Nyquist diagram, the impedance measurement value and the impedance reference value may be compared more easily around the inflection point. In addition, according to this embodiment, when comparing with Nyquist diagrams measured and generated from the same battery at different times, or when comparing with Nyquist diagrams measured and generated from other batteries, the comparison may be performed more easily and clearly. Moreover, according to this embodiment, the form around the inflection point may be more clearly compared and analyzed with respect to the Nyquist diagram.

In addition, the processor 300 may be configured to compare an impedance measurement value for a frequency region between a frequency as large as a first predetermined frequency and a frequency as small as a second predetermined frequency, centering around the extracted inflection point, with the impedance reference value. In particular, in the Nyquist diagram, the impedance measurement value for each frequency is indicated by impedance points. Accordingly, the processor 300 may be configured to search a predetermined number of impedance points in a high frequency direction and/or a low frequency direction from the inflection point, and compare the impedance measurement values of the found impedance points with the impedance reference value.

Here, the first predetermined frequency and the second predetermined frequency may be configured to be identical to each other. That is, the processor 300 may be configured to search the same number of impedance points in the high frequency direction and the low frequency direction, centering around the extracted inflection point.

For example, in the embodiment of FIG. 4, the processor 300 may be configured to search two impedance points in a low-frequency direction and a high-frequency direction around the inflection point f13, respectively, and compare the impedance measurement values of the searched impedance points with the impedance reference value. That is, the processor 300 may compare impedance measurement values of two points f14 and f15 in the low frequency direction (right direction) from the inflection point f13 and two points f11 and f12 in the high frequency direction (left direction) from the inflection point f13 with the impedance reference values corresponding to the same frequency as the frequency of each impedance point.

According to this configuration of the present disclosure, by analyzing the frequency information and the impedance measurement value of different measurement points away from the origin along with the frequency information of the origin, the impedance characteristics of the target battery around the inflection point may be more clearly figured out.

In addition, the processor 300 may be configured to diagnose the target battery by using the magnitude and angle of the impedance measurement value for the target battery. This will be described in more detail with reference to FIG. 5.

Figures 5, 6:
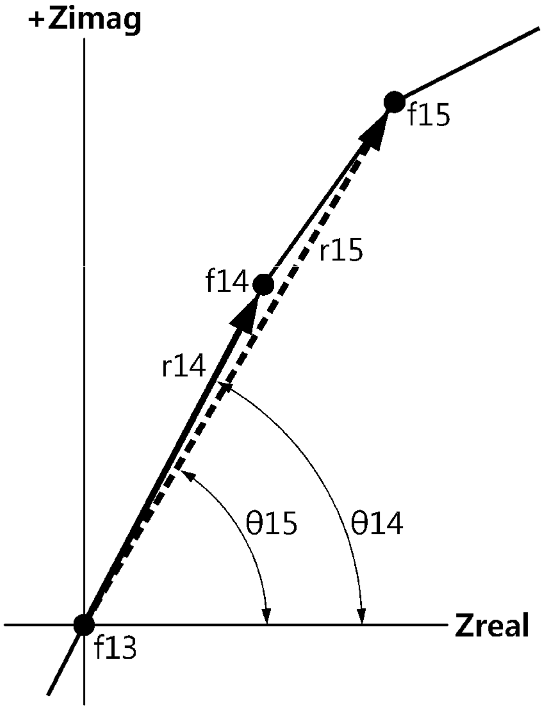
FIG. 5 is a diagram schematically showing a magnitude and angle of an impedance measurement value according to an embodiment of the present disclosure.
FIG. 6 is a diagram showing a part of impedance reference value data stored in the memory module according to an embodiment of the present disclosure.

FIG. 5 is a diagram schematically showing a magnitude and angle of an impedance measurement value according to an embodiment of the present disclosure.

More specifically, FIG. 5 may be regarded as a view where the Nyquist diagram of FIG. 4 is vertically inverted based on the horizontal axis (Z real) so that the positive imaginary portion (+Zimag) of the impedance is located at the upper portion. That is, in FIG. 4, the negative imaginary portion (−Zimag) of the impedance is shown to be located in the first and second quadrants, but in FIG. 5, the negative imaginary portion (−Zimag) of the impedance is shown to be located in the third and fourth quadrants. In addition, FIG. 5 is an enlarged view showing a low-frequency region within a predetermined frequency around the origin, namely only a partial region of the first quadrant. Accordingly, in FIG. 5, only the points f14 and f15 are shown among the plurality of impedance points.

In the drawing of FIG. 5, referring to the first point f14 in the low frequency direction (right direction) from the origin f13, its magnitude is indicated by r14 and its angle is indicated by θ14. In this case, the magnitude r14 and the angle θ14 may be calculated as follows.

$$r14=(x14^2+y14^2)^{1/2}$$

$$\theta 14=\tan^{-1}(y14/x14)$$

Here, x14 and y14 may be referred to as an x-axis component (real component of the impedance) and a y-axis component (imaginary component of the impedance) at the point f14, respectively. Also, in this way, the processor 300 may calculate a magnitude (r15) and an angle (θ15) for the point f15 that is a second point in the low frequency direction from the origin f13.

Also, although not shown in the drawings, the processor 300 may calculate the magnitudes and angles of the first point and the second point in the high frequency direction (left direction) from the origin f13 in a similar manner.

In this embodiment, the memory module 200 may store the magnitude and angle of the impedance as the impedance reference value corresponding to the plurality of frequencies. That is, the magnitude and angle of each impedance reference value may also be stored so as to be compared with the magnitude and angle of the impedance measurement value by the processor 300.

FIG. 6 is a diagram showing a part of impedance reference value data stored in the memory module 200 according to an embodiment of the present disclosure.

Referring to FIG. 6, the memory module 200 stores an impedance reference value corresponding to each of a plurality of frequencies (2.154 Hz, 1.468 Hz, 1 Hz, 0.681 Hz, 0.464 Hz). In particular, the impedance reference value stored in the memory module 200 has the magnitude and angle of the impedance per frequency. For example, in FIG. 6, the magnitude and angle of the impedance reference value corresponding to the frequency of 1.468 Hz may be 0.39 mΩ and −141.7°, respectively. In addition, the magnitude and angle of the impedance reference value corresponding to the frequency of 0.681 Hz may be 0.29 mΩ and −38.3°, respectively.

In particular, the memory module 200 may store the magnitude and angle of an impedance reference value for a predetermined frequency therearound, based on the case where a specific frequency is the origin. For example, as shown in FIG. 6, when the frequency point of 1 Hz is the origin, the memory module 200 may store the magnitude and angle of the impedance reference value for each of the surrounding frequencies (0.681 Hz, 0.464 Hz, 1.468 Hz, 2.154 Hz).

In this embodiment, the processor 300 may compare the magnitude and angle of the impedance measurement value for the target battery and the magnitude and angle of the impedance reference value stored in the memory module 200 with each other for the same frequency. In addition, the processor 300 may diagnose the battery according to the comparison result of the magnitude and angle.

In particular, with respect to the impedance measurement values, the processor 300 may be configured to compare impedance reference values whose origins have the same frequency. For example, the impedance reference value shown in FIG. 6 is set such that the origin has a frequency of 1 Hz. At this time, in the embodiment of FIG. 4, when the point indicated by f13 that is the inflection point is a point corresponding to a frequency of 1 Hz, the processor 300 may diagnose the target battery by comparing the impedance measurement value for the embodiment of FIG. 4 and the impedance reference value for the embodiment of FIG. 6 with each other.

More specifically, in the embodiment of FIG. 4, the points indicated by f11, f12, f14, and f15 may be points corresponding to frequencies of 2.154 Hz, 1.468 Hz, 0.681 Hz, and 0.464 Hz, respectively. In this case, the processor 300 may obtain the magnitude and angle of the impedance measurement value for each point of f11, f12, f14, f15, and compare the obtained magnitude and angle of each point with the magnitude and angle of the impedance reference value as shown in FIG. 6. Here, the magnitude and angle of the impedance measurement value at each point may be obtained as described in the embodiment of FIG. 5.

Meanwhile, at every frequency corresponding to various frequencies of the AC voltage applied by the impedance measuring module 100, the memory module 200 may store an impedance magnitude and an impedance angle as the impedance reference value corresponding to the frequency. In particular, for all frequencies available when the impedance measuring module 100 measures the impedance of the target battery, the memory module 200 may store in advance an impedance reference value corresponding to each frequency. For example, when the impedance measuring module 100 is set to measure the impedance by applying an AC voltage while changing the frequency like 2.154 Hz, 1.468 Hz, 1 Hz, 0.681 Hz, 0.464 Hz, . . . , the memory module 200 may store the impedance reference value corresponding to each of the same frequencies (2.154 Hz, 1.468 Hz, 1 Hz, 0.681 Hz, 0.464 Hz, . . . ) as the set frequencies of the impedance measuring module 100 in advance.

Alternatively, the impedance measuring module 100 may be configured to change the frequency according to the frequency stored in advance in the memory module 200 when applying an AC voltage. For example, if the impedance reference value is stored in advance in the memory module 200 in the form shown in FIG. 6, the impedance measuring module 100 may be configured to apply an AC voltage while changing the frequency like 2.154 Hz, 1.468 Hz, 1 Hz, 0.681 Hz and 0.464 Hz, and obtain an impedance measurement value for each frequency.

In addition, in the embodiment of FIG. 6, the form of the impedance reference value centered on the case where the origin is 1 Hz is illustrated, but the origin may not be 1 Hz. Accordingly, the memory module 200 may store not only the impedance reference value in the form shown in FIG. 6, but also may include data for various cases other than the case where the origin is 1 Hz. For example, the memory module 200 may store data about the magnitude and angle of the impedance reference value of the surrounding frequency points for the case where the origin is 0.681 Hz or 1.468 Hz. In this case, depending on the frequency of the extracted inflection point, the processor 300 may obtain impedance reference value data suitable therefor from the memory module 200 and compare the obtained impedance reference value data with the impedance measurement values.

The memory module 200 may store the impedance reference value per frequency to be classified for each of a plurality of battery levels. This will be described in more detail with reference to FIG. 7.

FIG. 7 is a diagram showing a part of impedance reference value data stored in the memory module 200 according to another embodiment of the present disclosure. Regarding FIG. 7, features different from the embodiment of FIG. 6 will be described in detail.

Referring to FIG. 7, the memory module 200 may store the impedance reference value per frequency in the form of a table, for example in a plurality of tables. In this case, each table may be called an impedance reference value per frequency group corresponding to each of different battery levels.

More specifically, the memory module 200 may classify the levels of the battery into three levels of Level 1, Level 2 and Level 3 and store the impedance reference value per frequency group for each battery level. Here, the frequency may be set to be the same for each battery level, and the impedance reference values of each battery level may have different magnitudes and angles.

In this configuration, the processor 300 may be configured to match the impedance measurement value of the target battery with the battery level stored in the memory module 200. In addition, the processor 300 may be configured to classify the level of the target battery according to the matching result.

In particular, the processor 300 may search an impedance reference value group identical or most similar to the impedance measurement value of the target battery among the impedance reference value groups of several battery levels stored in the memory module 200, and identify the battery level corresponding thereto. In addition, the level of the target battery may be classified by using the battery level identified in this way. For example, when it is determined that the magnitude and angle of the impedance measurement value for the target battery are most similar to the magnitude and angle of the impedance reference value group set to Level 1 of FIG. 7, the processor 300 may classify the level of the target battery to Level 1. Meanwhile, when it is determined that the magnitude and angle of the impedance measurement value for the target battery is most similar to the magnitude and angle of the impedance reference value group set to Level 2 or Level 3 of FIG. 7, the processor 300 may classify the level of the target battery to Level 2 or Level 3.

According to this configuration of the present disclosure, the level for the target battery may be effectively classified. In particular, according to this configuration of the present disclosure, when the battery is to be reused, the battery may classified according to the level in a relatively simple and clear way, which may be useful in determining the reusability, usage, sale price, or the like of the battery. For example, according to this embodiment of the present disclosure, for a lithium ion battery pack whose lifespan ends for an electric vehicle, the above configuration may be used to judge the usage, remaining life, performance, or the like of the battery pack.

In this embodiment, for the configuration for determining whether the impedance measurement value and the impedance reference value are identical or similar, various data matching techniques known at the time of filing of this application may be employed. In addition, in the present disclosure, various methods may be used as the configuration for determining whether the impedance measurement value and the impedance reference value are matched, and the present disclosure is not limited by any specific determination method.

In particular, the processor 300 may be configured to determine the state of health (SOH) of the target battery according to the level of the battery. For example, in the embodiment of FIG. 7, the SOH corresponding to Level 1 may be 80%, the SOH corresponding to Level 2 may be 75%, and the SOH corresponding to Level 3 may be 70%. In this case, the processor 300 may estimate the SOH of the target battery by determining the level of the impedance reference value that is most similar to the impedance measurement value. If it is determined that the impedance measurement value of the target battery is most similar to the impedance reference value group of Level 2, the processor 300 may estimate the SOH of the target battery as 75% corresponding to Level 2. According to this embodiment, the processor 300 may easily figure out the SOH of the target battery.

Meanwhile, in the embodiment of FIG. 7, only three battery levels are illustrated, but this is only for convenience of description, and the memory module 200 may store the impedance reference value per frequency for each of four or more battery levels. In particular, as the battery level is subdivided into a very large number, the target battery may be diagnosed and classified into various levels more accurately. For example, the memory module 200 may classify the SOH from 100% to 0% at intervals of 2.5%, and respectively store the impedance reference value per frequency group for each classified SOH.

In addition, in the embodiment of the FIGS. 6 and 7, it has been illustrated that the two impedance points are searched and compared in the high frequency direction and the low frequency direction, respectively, based on the impedance point for the frequency of 1 Hz. However, the number of times of comparing the impedance points based on the origin is merely an example, and the present disclosure is not limited to a specific example of this number. For example, based on the origin, it may be configured to compare three or four impedance points in the high frequency direction and the low frequency direction, respectively.

If the Nyquist diagram for the impedance measurement value of the target battery is generated, the processor 300 may be configured to extract a point where the charge transfer resistance region is inflected by the diffusion resistance region in the generated Nyquist diagram, as an inflection point. This will be described in more detail with reference to FIG. 8.

Figure 8:
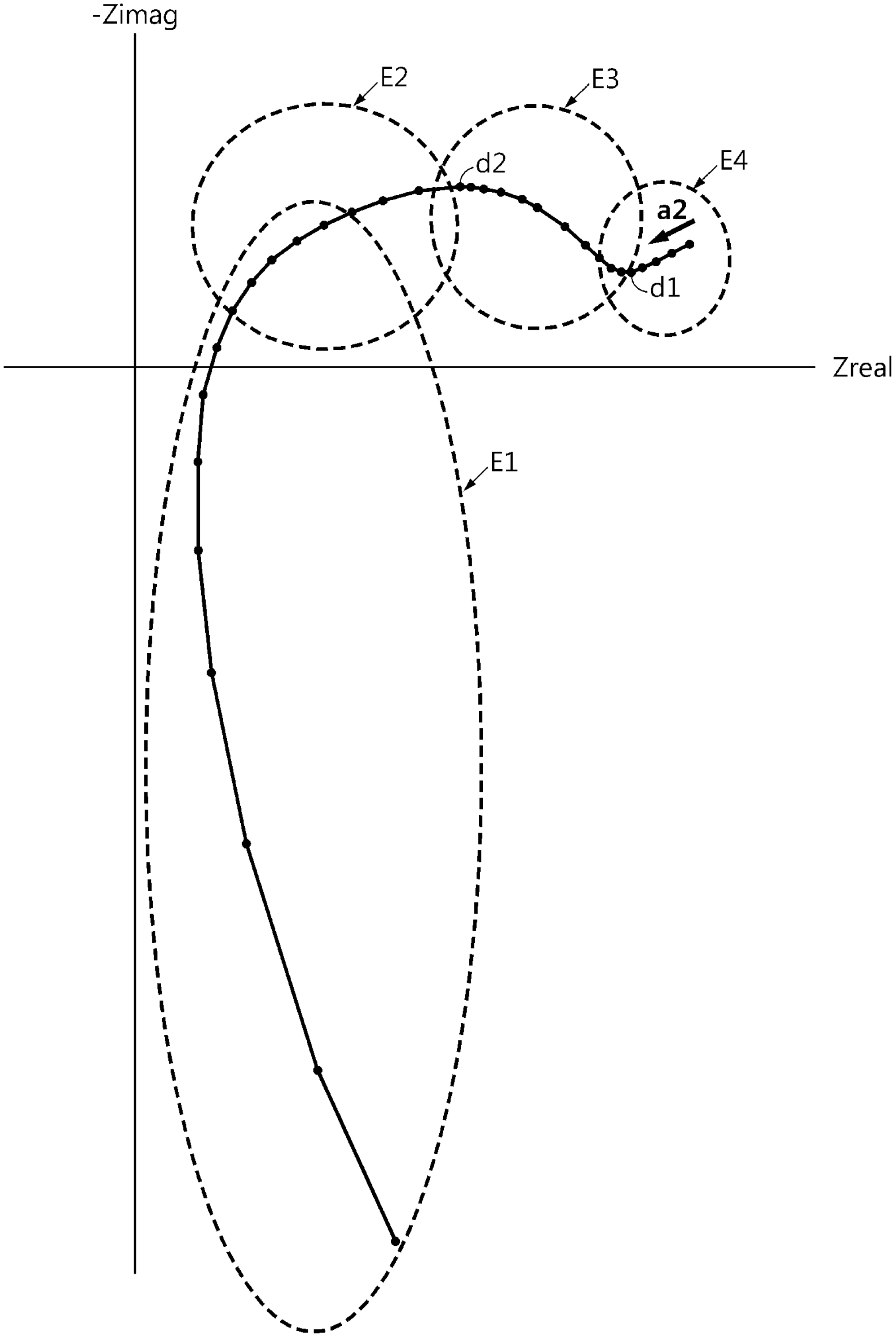
FIG. 8 is a diagram showing a Nyquist diagram generated according to an embodiment of the present disclosure, in which each region is classified according to the type of factor affecting the impedance.

FIG. 8 is a diagram showing a Nyquist diagram generated according to an embodiment of the present disclosure, in which each region is classified according to the type of factor affecting the impedance. In FIG. 8, basic features are identical to FIG. 3, so different features will be described in detail.

Referring to FIG. 8, the EIS Nyquist diagram may be divided into four regions E1, E2, E3, E4 for each factor affecting the impedance of the battery. First, the E1 region is a highest frequency region, and may be mainly determined by the electrolyte resistance inside the target battery. Next, the E2 region is a lower frequency region than the E1 region but is a higher frequency region than the E3 region, and may be a region mainly affected by the SEI (Solid Electrolyte Interphase) or the like formed on the electrode particle surface of the target battery. In addition, the E3 region is a lower frequency region than the E2 region, and may be a region mainly affected by charge transfer of the target battery. In particular, the E3 region may be determined by Li ion oxidation and reduction reactions at the electrode material interface of the target battery. The E3 region may be regarded as a charge transfer resistance region. Finally, the E4 region is a lowest frequency band, and may be a region mainly affected by diffusion. In particular, the E4 region may be determined by chemical diffusion by interlayer insertion into the grain crystal structure in the target battery. The E4 region may be regarded as a diffusion resistance region. The memory module 200 may store the information about these four regions, for example the frequency information ranges, in advance.

The processor 300 may be configured to search an inflection point in the charge transfer resistance region E3, among the four regions. In particular, in the EIS Nyquist diagram, the charge transfer resistance region E3 may be inflected by the diffusion resistance region E4. The processor 300 may extract a point where the charge transfer resistance region E3 is inflected by the diffusion resistance region E4 as described above as the inflection point. Moreover, in the Nyquist diagram, two or more inflection points may exist. In this case, the processor 300 may extract a point where the charge transfer resistance region E3 is inflected by the diffusion resistance region E4 among the two or more inflection points, and diagnose the battery or classify the level of the battery by using the inflection point extracted in this way.

For example, in the Nyquist diagram of FIG. 4, the processor 300 may extract the point f13 as a point where the charge transfer resistance region E3 is inflected by the diffusion resistance region E4. In addition, the processor 300 may diagnose the target battery by using the f13 point as a final inflection point.

According to this configuration of the present disclosure, when diagnosing the target battery using the EIS data, the accuracy of battery diagnosis may be improved by using the low frequency region instead of the high frequency region. In particular, the high-frequency region such as the region E1 of FIG. 8 may be a region that is greatly affected by the inductance or resistance component of the measurement probe. Therefore, when using a portion heavily affected by the E1 region or an inflection point within the E1 region, the deviation may be severe and the accuracy may be reduced. However, according to the above embodiment, the data of the E3 and E4 regions, which are low-frequency regions not significantly affected by the E1 region, are analyzed, and the battery may be diagnosed through the data. Therefore, in this case, the influence of the inductance and resistance components of the measurement probe may be minimized, and thus the accuracy of battery diagnosis may be further improved.

In addition, the processor 300 may be configured to extract an inflection point by searching in a direction from a low frequency region to a high frequency region with respect to the generated Nyquist diagram. For example, in the embodiment of FIG. 8, as indicated by arrow a2, the processor 300 may be configured to search an inflection point while moving from a predetermined point on the right part of the Nyquist diagram in a left direction. That is, the processor 300 may be configured to extract an inflection point while moving from a low frequency region to a high frequency region in the EIS Nyquist diagram.

In particular, the processor 300 may search inflection points while moving from the low frequency region to the high frequency region, and extract the first searched inflection point among them. In addition, the processor 300 may perform the battery diagnosis process described above by using the first inflection point searched in this way. In the Nyquist diagram, the charge transfer resistance region and the diffusion resistance region as indicated by E3 and E4 of FIG. 8 may exist in the low frequency region. Therefore, the first searched inflection point in the low frequency region may be regarded as a point where the charge transfer resistance region is inflected by the diffusion resistance region.

Therefore, according to this embodiment, it is easy to figure out a point where the charge transfer resistance region is inflected by the diffusion resistance region.

This inflection point extraction configuration will be described in more detail with reference to FIG. 9.

Figure 9:
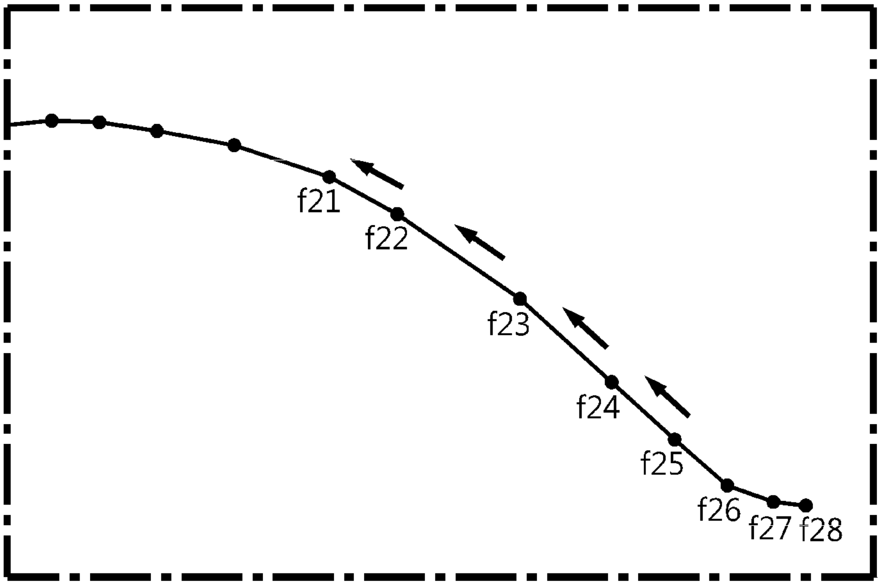
FIG. 9 is a diagram schematically showing a configuration in which an inflection point is extracted by the processor according to an embodiment of the present disclosure.

FIG. 9 is a diagram schematically showing a configuration in which an inflection point is extracted by the processor 300 according to an embodiment of the present disclosure. In particular, FIG. 9 may be regarded as an enlarged graph of the region E3 of FIG. 8.

Referring to FIG. 9, the processor 300 may search an inflection point by comparing and analyzing inclinations in a direction in which frequency gradually increases, as indicated by an arrow in the EIS Nyquist diagram.

More specifically, the inclinations for the impedance points measured at each frequency may be calculated as follows.

$$\text{Inclination}=(\text{EISi}[i+1]-\text{EISi}[i])/(\text{EISr}[i+1]-\text{EISr}[i])$$

Here, it may be seen that EISi[i] means an imaginary component of an impedance point i, and EISr[i] means a real component of the impedance point i.

For example, in the embodiment of FIG. 9, the processor 300 may calculate an inclination C between the impedance point f24 and the impedance point f25 as follows.

$$\text{Inclination } C=(\text{EISi}[f25]-\text{EISi}[f24])/(\text{EISr}[f25]-\text{EISr}[f24])$$

In addition, in this way, the processor 300 may obtain an inclination between points, for example, between f23 and f24, between f22 and f23, between f21 and f22, and the like. In addition, the processor 300 may extract a point where the magnitude (absolute value) of the inclination between each impedance points gradually increases in the arrow direction (high frequency direction) and then decreases again, as an inflection point.

For example, in the embodiment of FIG. 9, when that the magnitude (absolute value) of the inclination of the Nyquist diagram gradually increases from the point f28 to the point f23 and decreases from the point f23, the processor 300 may extract the point f23 as an inflection point. That is, the processor 300 may extract a point where the absolute value of the inclination increases and then decreases as the inflection point. Alternatively, the processor 300 may compare the change of inclination while moving in the high frequency direction along the Nyquist diagram, and extract the first point where the change of inclination changes from positive (+) to negative (−) as an inflection point. In particular, the inflection point may be regarded as a point in the Nyquist diagram where the charge transfer resistance region is inflected by the diffusion resistance region. In this case, the inflection point used to diagnose or classify the battery may be easily extracted.

In this embodiment, the processor 300 may obtain in advance the information about a point where searching an inflection point starts in the Nyquist diagram. For example, the memory module 200 may store the impedance point information corresponding to the inflection point search start point in advance, and the processor 300 may identify the impedance point information by accessing the memory module 200 before extracting the inflection point. In addition, based on the impedance point information identified through the memory module 200 as described above, the processor 300 may be configured to search an inflection point from the corresponding point.

For example, in the embodiment of FIG. 9, the memory module 200 may store the point f27 in advance as the impedance point for starting the inflection point search. Then, the processor 300 may identify this information from the memory module 200 and search an inflection point in the direction from the point f27 to points f26, f25, f24, . . . .

Here, the impedance point information for the inflection point search start point may be frequency information. For example, the memory module 200 may store in advance the frequency information corresponding to the point f27 in the embodiment of FIG. 9. In this case, the processor 300 may determine the inclination of the impedance diagram from the frequency corresponding to the point f27 to the higher frequency direction gradually, and extract the inflection point.

Alternatively, the impedance point information for the inflection point search start point may be information corresponding to the real component of the impedance. For example, the memory module 200 may store in advance the real component information of the impedance for the point f27.

Alternatively, the processor 300 may determine by itself, without obtaining the information about the inflection point search start point from the memory module 200. In particular, the processor 300 may identify a minimum point and a maximum point while moving from the low frequency part to the high frequency direction in the Nyquist diagram. In addition, the processor 300 may be configured to extract an inflection point between the minimum point and the maximum point identified as described above.

For example, seeing the embodiment illustrated in FIG. 8, the processor 300 may identify a portion d1 that is the minimum point and a portion d2 that is the maximum point in the Nyquist diagram. In addition, the processor 300 may be configured to extract an inflection point in a region between the minimum point d1 and the maximum point d2 identified as described above.

In this case, the point where the charge transfer resistance region is inflected by the diffusion resistance region may be easily identified in the Nyquist diagram.

Meanwhile, in the EIS Nyquist diagram, two or more maximum points and/or minimum points may exist. In this case, by using a maximum point and/or a minimum point having a lowest frequency among a plurality of maximum points and/or a plurality of minimum points, the processor 300 may extract an inflection point existing therebetween. That is, the processor 300 checks the minimum point and the maximum point of the Nyquist diagram while moving in the direction indicated by the arrow a2 in the embodiment of FIG. 8, but may extract an inflection point existing between the firstly identified minimum point and maximum point and diagnose the battery using the extracted inflection point.

In addition, the memory module 200 may store preliminary frequency information about the inflection point in advance. Here, the preliminary frequency information about the inflection point may be information about the frequency at which an inflection point is estimated to exist. In particular, the memory module 200 may store in advance information about a frequency range in which an inflection point is estimated to exist, as the preliminary frequency information.

For example, the memory module 200 may store in advance a preliminary frequency range of 0.4 Hz to 2.2 Hz as the frequency information at which an inflection point is estimated to exist. In this case, the processor 300 may be configured to first search an inflection point within the preliminary frequency range of 0.4 Hz to 2.2 Hz.

According to this configuration of the present disclosure, it is possible to reduce the search range when the processor 300 extracts the inflection point. Accordingly, in this case, the inflection point extraction rate of the processor 300 may be improved, and the computational load in the extraction process may be reduced.

Moreover, the memory module 200 may store the preliminary frequency information in multiple stages. In this case, the processor 300 may sequentially use the preliminary frequency information stored in multiple stages. In this case, a ranking may be predetermined among the preliminary frequency information stored in multiple stages. In addition, the processor 300 may search a prior-order frequency information first from the preliminary frequency information stored in multiple stages, and then, if an inflection point is not extracted from the searched prior-order preliminary frequency information, the processor 300 may be configured to search a preliminary frequency information of the next order.

For example, the memory module 200 may store primary preliminary frequency information, secondary preliminary frequency information, and thirdly preliminary frequency information. In this case, the primary preliminary frequency information may have the highest priority, and the thirdly preliminary frequency information may have the lowest priority. In this case, the processor 300 may first extract an inflection point within a corresponding range with reference to the primary preliminary frequency information. In addition, if an inflection point is not extracted from the primary preliminary frequency information, an inflection point may be extracted within a corresponding range with reference to the secondary preliminary frequency information. Also, if an inflection point is not extracted even at this time, an inflection point may be extracted with reference to the thirdly preliminary frequency information.

According to this configuration of the present disclosure, the inflection point extraction rate and efficiency may be further improved.

The memory module 200 may store the preliminary frequency information about the inflection point to be classified according to the magnitude of the AC voltage applied to the battery. That is, when the impedance measuring module 100 measures an impedance according to the change of frequency while applying an AC voltage to the target battery, the preliminary frequency information may be configured to vary according to the magnitude of the applied AC voltage.

For example, the memory module 200 may store the preliminary frequency information as fp1 when the impedance measuring module 100 measures the impedance of the target battery while applying an AC voltage of 0.5V. In addition, the memory module 200 may store the preliminary frequency information as fp2 when the impedance measuring module 100 measures the impedance of the target battery while applying an AC voltage of 0.7V. In this case, fp1 and fp2 may be set as different frequency values or different frequency ranges.

According to this configuration of the present disclosure, when the processor 300 extracts the inflection point using the preliminary frequency information stored in the memory module 200, the inflection point may be more effectively extracted. In particular, the form of the EIS Nyquist diagram may vary depending on the magnitude of the applied voltage. Therefore, according to the above embodiment, it is possible to efficiently extract an inflection point by providing suitable preliminary frequency information in consideration of the form change according to the magnitude of the applied voltage.

The battery diagnosing apparatus according to the present disclosure may be applied to a battery pack. That is, the battery pack according to the present disclosure may include the battery diagnosing apparatus according to the present disclosure described above. In addition, the battery pack according to the present disclosure may further include components typically included in the battery pack, such as one or more secondary batteries, BMS (Battery Management System), current sensors, relays, fuses, a pack case and the like, in addition to the battery diagnosing apparatus according to the present disclosure. In this case, the secondary battery included in the battery pack may be a target diagnosed by the battery diagnosing apparatus according to the present disclosure, namely a target battery. In addition, at least some components of the battery diagnosing apparatus according to the present disclosure may be implemented as conventional components included in the battery pack. For example, at least some functions or operations of the processor 300 of the battery diagnostic apparatus according to the present disclosure may be implemented by the BMS included in the battery pack.

In addition, the battery diagnosing apparatus according to the present disclosure may be applied to an energy storage system (ESS). That is, the energy storage system according to the present disclosure may include the battery diagnosing apparatus according to the present disclosure described above. In particular, since the energy storage system does not require as high an output as an electric vehicle, it may be a representative application for recycling a battery pack (waste battery) that has been used in an electric vehicle until the end of its lifespan. The energy storage system may determine whether or to mount or utilize the battery after diagnosing the battery or classifying the level of the battery by using the battery diagnosis technology according to the present disclosure before mounting the waste battery.

Figure 10:
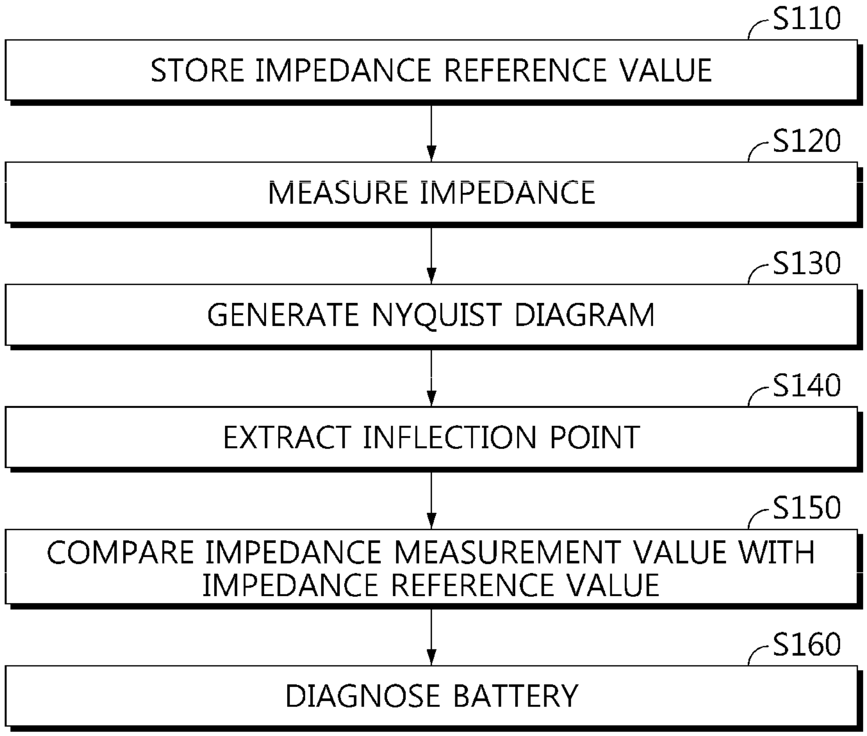
FIG. 10 is a flowchart for schematically illustrating a battery diagnosing method according to an embodiment of the present disclosure.

FIG. 10 is a flowchart schematically showing a battery diagnosing method according to an embodiment of the present disclosure. In FIG. 10, each step may be performed by each component of the battery diagnosing apparatus described above. Referring to FIG. 10, the battery diagnosing method according to the present disclosure may include an impedance reference value storing step (S110), an impedance measuring step (S120), a Nyquist diagram generating step (S130), an inflection point extracting step (S140), a comparing step (S150) and a diagnosing step (S160).

The step S110 is a step of storing an impedance reference value for each frequency. For example, the step S110 may store impedance reference value information as shown in FIG. 6 or 7 through a pre-test.

The step S120 is a step of measuring an impedance according to the change of frequency while applying an AC voltage to the target battery. The step S130 is a step of generating a Nyquist diagram for the impedance measurement value of the target battery measured in the step S120. For example, by the step S130, a Nyquist diagram as shown in FIG. 3 may be generated.

The step S140 is a step of extracting an inflection point from the Nyquist diagram generated in the step S130. For example, in the step S140, as described in the embodiment of FIG. 9, the inflection point of the Nyquist diagram may be extracted.

The step S150 is a step of comparing a value within a predetermined frequency range centering around the inflection point extracted in the step S140 with the impedance reference value per frequency stored in the step S110.

In addition, the step S160 is a step of diagnosing the target battery based on the result compared in the step S150. For example, by the step S160, the level of the target battery may be classified.

For the battery diagnosing method according to the present disclosure, the features described with respect to the battery diagnosing apparatus may be applied in an identical or similar manner, and will not be described in detail.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

REFERENCE SIGNS

100: impedance measuring module
200: memory module
300: processor

What is claimed is:

1. A battery diagnosing apparatus, comprising:
an impedance measuring module configured to measure an impedance according to a change of frequency while applying an alternating current (AC) voltage to a target battery;
a memory module configured to store an impedance reference value per frequency; and
a processor configured to
generate a Nyquist diagram for an impedance measurement value of the target battery measured by the impedance measuring module,
extract an inflection point from the generated Nyquist diagram,
shift the generated Nyquist diagram so that the extracted inflection point becomes an origin to exclude errors occurring in a constant value extraction process of the impedance measuring module,
select a value within a predetermined frequency range of impedance points centering around the extracted inflection point and compare the value with the impedance reference value per frequency in a shifted state stored in the memory module,
determine whether the value is outside of the impedance reference value by an error range,
determine that the target battery is abnormal based on the determination that the value is outside of the impedance reference value by the error range, and
classify a level of the target battery by matching the value with a battery level to determine usage or removal of the target battery from being recycled or reused.

2. The battery diagnosing apparatus according to claim 1, wherein the processor is configured to diagnose the target battery using a magnitude and an angle of the impedance measurement value for the target battery.

3. The battery diagnosing apparatus according to claim 1, wherein the memory module is configured to store the impedance reference value per frequency to be classified into each of a plurality of battery levels, and
wherein the processor is configured to classify the level of the target battery by matching the impedance measurement value of the target battery with the battery level stored in the memory module from among the plurality of battery levels.

4. The battery diagnosing apparatus according to claim 1, wherein the processor is configured to extract a point where a charge transfer resistance region is inflected by a diffusion resistance region as the inflection point in the generated Nyquist diagram.

5. The battery diagnosing apparatus according to claim 4, wherein the processor is configured to extract the inflection point by searching the generated Nyquist diagram from a low frequency region to a high frequency region thereof.

6. The battery diagnosing apparatus according to claim 1, wherein the memory module is configured to store preliminary frequency information for the inflection point in advance.

7. A battery pack, comprising the battery diagnosing apparatus according to claim 1.

8. An energy storage system, comprising the battery diagnosing apparatus according to claim 1.

9. A battery diagnosing method, comprising:
storing an impedance reference value per frequency;
measuring an impedance according to a change of frequency while applying an alternating current (AC) voltage to a target battery;
generating a Nyquist diagram for an impedance measurement value of the target battery measured in the measuring of the impedance;
extracting an inflection point from the Nyquist diagram generated in the generating of the Nyquist diagram;
shifting the generated Nyquist diagram so that the extracted inflection point becomes an origin to exclude errors occurring in a constant value extraction process for measuring of the impedance;
selecting the impedance measurement value within a predetermined frequency range of impedance points centering around the inflection point extracted in the extracting of the inflection point and comparing the impedance measurement value with the impedance reference value per frequency in a shifted state stored in the storing of the impedance reference value per frequency;
determining whether the impedance measurement value is outside of the impedance reference value by an error range;
determining that the target battery is abnormal based on the determination that the impedance measurement value is outside of the impedance reference value by the error range; and
classifying a level of the target battery by matching the impedance measurement value with a battery level to determine usage or removal of the target battery from being recycled or reused.

10. The battery diagnosing method according to claim 9, wherein the selecting of the impedance measurement value is performed only within the predetermined frequency range of impedance points centering around the extracted inflection point so that the determining of whether the target battery is abnormal is performed without using an equivalent circuit model requiring extraction of various constant values for the equivalent circuit model of the Nyquist diagram in relation to the target battery.

11. The battery diagnosing apparatus of claim 1, wherein the processor is configured to select the value only within the predetermined frequency range of impedance points centering around the extracted inflection point so as to determine whether the target battery is abnormal without using an equivalent circuit model requiring extraction of various constant values for the equivalent circuit model of the Nyquist diagram in relation to the target battery.

12. The battery diagnosing method according to claim 9, further comprising measuring the impedance while the target battery is in a charging process, and adjusting a charging current of the charging process in real-time based on the classified level of the target battery.

13. The battery diagnosing apparatus of claim 1, wherein the impedance measuring module is configured to measure the impedance while the target battery is in a charging process, and the processor is configured to adjust a charging current of the charging process in real-time based on the classified level of the target battery.

* * * * *